United States Patent [19]
Swenson et al.

[11] Patent Number: 6,025,256
[45] Date of Patent: Feb. 15, 2000

[54] LASER BASED METHOD AND SYSTEM FOR INTEGRATED CIRCUIT REPAIR OR RECONFIGURATION

[75] Inventors: Edward J. Swenson, Portland; Yunlong Sun, Aloha; Richard S. Harris, Portland, all of Oreg.

[73] Assignee: Electro Scientific Industries, Inc., Portland, Oreg.

[21] Appl. No.: 08/898,555

[22] Filed: Jul. 22, 1997

Related U.S. Application Data

[60] Provisional application No. 60/034,232, Jan. 6, 1997.

[51] Int. Cl.$^7$ .................................................. H01L 21/44
[52] U.S. Cl. ............................................ 438/601; 438/132
[58] Field of Search .................... 438/130–132, 438/467, 600–601

[56] References Cited

U.S. PATENT DOCUMENTS

| | | | |
|---|---|---|---|
| 4,228,528 | 10/1980 | Cenker et al. | 365/200 |
| 4,414,059 | 11/1983 | Blum et al. | 156/659.1 |

(List continued on next page.)

FOREIGN PATENT DOCUMENTS

| | | | |
|---|---|---|---|
| 0231794 | 12/1987 | European Pat. Off. | H01L 21/285 |
| 0272799 | 6/1988 | European Pat. Off. | H01L 21/00 |
| 0385911 | 9/1990 | European Pat. Off. | B23K 26/00 |
| 0272799 | 2/1993 | European Pat. Off. | H01L 21/00 |
| 0580408 | 1/1994 | European Pat. Off. | |
| 9001374 | 2/1990 | WIPO | B05B 3/06 |
| 9602351 | 2/1996 | WIPO | B23K 26/00 |

OTHER PUBLICATIONS

Brannon, James H., "Excimer–Laser Ablation and Etching," Sep. 1990, *Circuits and Devices Magazine* pp 19–24.

Allen, R.D. et al, "New Single–Layer Positive Resists for 193–and 248–nm Lithography Using Methacrylate Polymers," Solid State Technology, Nov. 1993, pp 53–66.

Smith, Robert T. et al, "Laser Programmable Redundancy and Yield Improvement in a 64K DRAM," IEEE Journal of Solid–State Circuits, vol. SC–16, No. 5, (Oct. 1981), pp 506–514.

Table of Contents from "Handbook of Microlithography, Micromachining, and Microfabrication" vol. 1 Edited by P. Rai—Choudbury; SPIE vol. PM39.

Smart and Stewart, "Laser Processing for Application Specific Integrated Circuits (ASICs)", *Lasers in Microlithography*, vol. 774, Mar. 2–3, 1987, Pub. by SPIE, Santa Clara, California.

*Primary Examiner*—Jey Tsai
*Attorney, Agent, or Firm*—Stoel Rives LLP

[57] ABSTRACT

The present invention provides a method and system for irradiating resist material from multiple target positions (150) on one or more IC chips (12) with individually directed laser output pulses (74, 94). In one embodiment, an IC (12), including one or more etch targets (104, 106) such as conductive links (72, 92), is coated with an etch protection layer (90) of photoresist material. Then, position data direct, toward multiple positions (150) on the photoresist material, individual laser output pulses (94) of predetermined parameters selected to expose the photoresist material. Because photoresist exposure requires less energy than link blowing, low-power UV lasers (120) can be employed, and their shorter wavelengths permit a smaller practical laser output spot size (98). Because the nonablative process does not generate debris, an optical component (148) can be brought within 10 mm of etch protection layer (90) to focus the laser output pulses (94) to a spot size of less than two times the wavelength of laser output (140). Thus, an advantage of this embodiment permits microcircuit manufacturers to decrease the pitch distance (28) between circuit elements (14). After the photoresist layer (90) is developed, the accessible etch target (92) can be etched to repair or reconfigure the IC device. In another embodiment, slightly higher UV power laser output pulses (74) can be employed to ablate an etch protection resist layer (70) so any type of etch protection coating such as nonphotosensitive resist materials can be utilized with substantial manufacturing and cost benefits. Etching of the accessible etch targets (60, 62) follows this process.

30 Claims, 4 Drawing Sheets

U.S. PATENT DOCUMENTS

| | | | |
|---|---|---|---|
| 4,445,978 | 5/1984 | Whartenby et al. | 204/15 |
| 4,508,749 | 4/1985 | Brannon et al. | 427/43.1 |
| 4,532,402 | 7/1985 | Overbeck | 219/121 |
| 4,568,409 | 2/1986 | Caplan | 156/643 |
| 4,598,039 | 7/1986 | Fischer et al. | 430/323 |
| 4,599,136 | 7/1986 | Araps et al. | 156/643 |
| 4,602,420 | 7/1986 | Saito | 29/571 |
| 4,615,904 | 10/1986 | Ehrlich et al. | 427/38 |
| 4,619,894 | 10/1986 | Bozler et al. | 430/942 |
| 4,622,058 | 11/1986 | Leary-Renick et al. | 65/105 |
| 4,622,095 | 11/1986 | Grobman et al. | 156/635 |
| 4,640,738 | 2/1987 | Fredericks et al. | 156/656 |
| 4,647,476 | 3/1987 | Anthony | 427/97 |
| 4,684,437 | 8/1987 | Donelon et al. | 156/643 |
| 4,700,214 | 10/1987 | Johnson | 357/68 |
| 4,720,470 | 1/1988 | Johnson | 437/173 |
| 4,780,177 | 10/1988 | Wojnarowski et al. | 156/643 |
| 4,795,720 | 1/1989 | Kawanabe et al. | 437/52 |
| 4,796,038 | 1/1989 | Allen et al. | 354/4 |
| 4,806,921 | 2/1989 | Goodman et al. | 340/747 |
| 4,832,788 | 5/1989 | Nemiroff | 156/643 |
| 4,834,834 | 5/1989 | Ehrlich et al. | 156/635 |
| 4,853,758 | 8/1989 | Fischer | 357/51 |
| 4,894,115 | 1/1990 | Eichelberger et al. | 156/643 |
| 4,897,153 | 1/1990 | Cole et al. | 156/643 |
| 4,941,082 | 7/1990 | Pailthorp et al. | 364/167.01 |
| 4,943,032 | 7/1990 | Zdeblick | 251/11 |
| 4,965,702 | 10/1990 | Lott et al. | 361/401 |
| 4,970,369 | 11/1990 | Yamazaki et al. | 219/121.85 |
| 5,021,362 | 6/1991 | Chlipala | 437/173 |
| 5,066,998 | 11/1991 | Fischer et al. | 357/51 |
| 5,087,396 | 2/1992 | Zablotony et al. | 264/25 |
| 5,096,850 | 3/1992 | Lippitt, III | 437/173 |
| 5,153,408 | 10/1992 | Handford et al. | 219/121.64 |
| 5,185,291 | 2/1993 | Fischer et al. | 437/173 |
| 5,206,874 | 4/1993 | Opower | 372/72 |
| 5,236,551 | 8/1993 | Pan | 156/643 |
| 5,245,751 | 9/1993 | Locke et al. | 29/852 |
| 5,265,114 | 11/1993 | Sun et al. | 372/69 |
| 5,289,416 | 2/1994 | Iwai et al. | 365/200 |
| 5,293,025 | 3/1994 | Wang | 219/121.71 |
| 5,329,152 | 7/1994 | Janai et al. | 257/529 |
| 5,331,203 | 7/1994 | Wojnarowski et al. | 257/698 |
| 5,391,516 | 2/1995 | Wojnarowski et al. | 437/174 |
| 5,536,579 | 7/1996 | Davis et al. | 428/421 |
| 5,541,731 | 7/1996 | Freedenberg et al. | 356/345 |
| 5,593,606 | 1/1997 | Owen et al. | 219/121.71 |
| 5,731,047 | 3/1998 | Noddin | 427/555 |

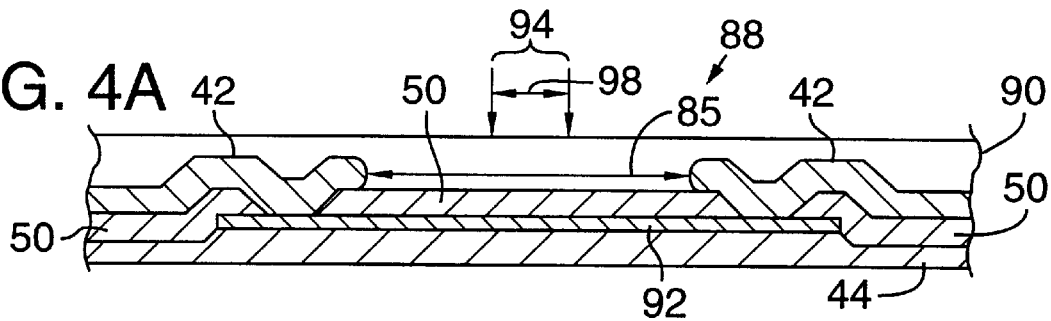
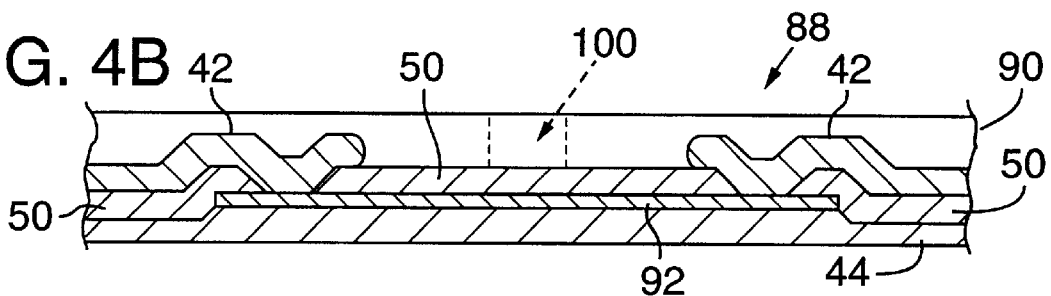
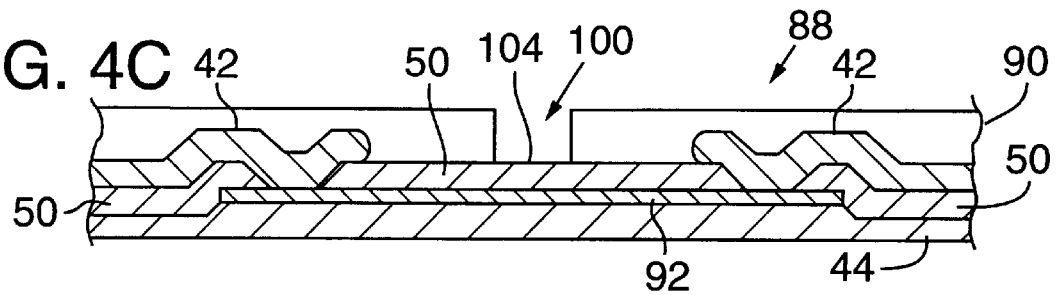
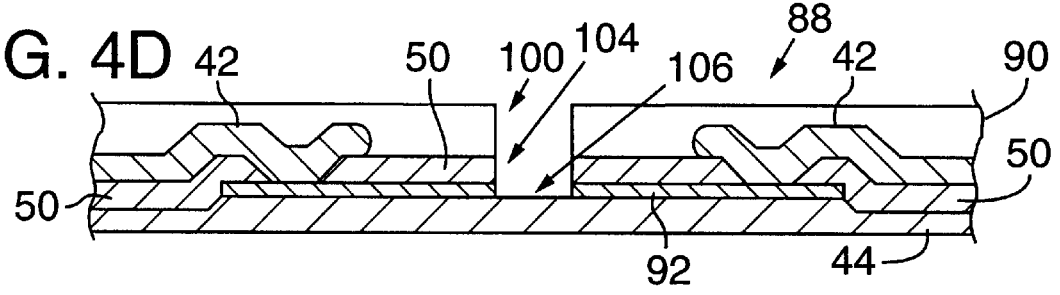

LASER BASED METHOD AND SYSTEM FOR INTEGRATED CIRCUIT REPAIR OR RECONFIGURATION

This patent application derives priority from provisional application Ser. No. 60/034,232, filed Jan. 6, 1997.

TECHNICAL FIELD

The present invention relates to laser methods and systems for memory and logic integrated circuit production and repair and, in particular, to creating unique patterns on an etch protection top layer material in response to reconfiguration data unique to each integrated circuit.

BACKGROUND OF THE INVENTION

IC (integrated circuit) device fabrication on semiconductor wafers, which is presented herein only by way of example to processing and the manufacture of logic products and memory devices such as DRAMs, SRAMs, and embedded memories that contain electrically conductive links, typically employs photoresist layering and patterning to identify areas of the IC device for subsequent processing such as doping or removal. Photoresist materials are etch resistant and protect covered areas of the IC device from at least one subsequent processing step.

Photolithography is a typical wafer patterning process that employs photoresist materials sensitive to certain wavelengths of light that traditionally match the emission wavelengths of the lines of a mercury lamp such as G (436 nm), H (408 nm), or I (365 nm) or the emission wavelengths of excimer lasers such as ArF (193 nm) and KrF (248 nm). Conventional photoresist materials generally comprise positive photoresists that become soluble where exposed to light and negative photoresists that become polymerized (insoluble) where exposed to light.

In photolithography, a required pattern is first formed in expensive reticles or photomasks and then transferred into a resist layer of a wafer. Lamp sources and, more recently, certain types of laser systems have been employed for simultaneously exposing the resist layer of every IC device on a wafer to a reverse image of the photomask. Photolithography is, therefore, especially suited for batch fabrication of repeatable features on IC devices. Photolithography and other VLSI (very large scale integration) memory fabrication processes are described in detail in *Handbook of Microlithography, Micromachining, and Microfabrication: Volume 1: Microlithography,* Edited by P. Rai-Choudbury, SPIE Volume PM39 and *VLSI Fabrication Principles: Silicon and Gallium Arsenide,* by Sorab K. Ghandi, 1994, © John Wiley & Sons, Inc.

The yield of an IC memory fabrication process is affected by a variety of factors. Some defects result from alignment variations of subsurface layers or patterns, and other defects result from particulate contaminants and defects in the silicon substrate. FIGS. 1, 2A, and 2B show repetitive electronic circuits 10 of an IC device 12 (FIG. 6) that are commonly fabricated to include multiple iterations of redundant circuit elements 14, such as spare rows 16 and columns 18 of memory cells 20. With reference to FIGS. 2A and 2B, circuits 10 are also designed to include particular circuit links 22 that can be removed to disconnect a defective memory cell 20, for example, and substitute a replacement redundant cell 24. Links 22 are designed with conventional link widths 25 (about 2.5 $\mu$m), link lengths 26, and element-to-element pitches (center-to-center spacings) 28 of about 8 $\mu$m from adjacent circuit structures or elements 30, such as link structures 38. Circuits 10, circuit elements 14, or cells 20 are tested for defects, the locations of which may be mapped into a database or program. Because the defects are unique from wafer 32 (FIG. 6) to wafer 32 and IC device 12 to IC device 12, the repair process cannot be accomplished with conventional photolithographic processes that employ fixed patterned photomasks.

However, certain lasers can precisely deliver laser pulses 34 having a laser spot 36 that is big enough to envelop and "blow" link 22 but generally small enough to avoid adjacent circuit elements 30. The early physics and computer modeling for laser-based link blowing are described by L. M. Scarfone and J. D. Chlipala, "Computer Simulation of Target Link Explosion in Programmable Redundancy for Silicon Memory," *Journal of Materials Research,* Vol. 1, No. 2, March–April 1986, at 368–81, and J. D. Chlipala, L. M. Scarfone, and Chih-Yuan Lu, "Computer-Simulated Explosion of Poly-Silicide Links in Laser-Programmable Redundancy for VLSI Memory Repair," *IEEE Transactions on Electron Devices,* Vol. 36, No. 6, June 1989, at 1056–61. Laser link blowing is now well-refined and is the method of choice for disconnecting links. The most prevalent link materials are polysilicon and like compositions, which respond well to conventional 1.047 $\mu$m or 1.064 $\mu$m laser wavelengths. FIG. 2C shows a conventional link structure 38 of FIG. 2A after a passivation layer 40 and link 22 have been removed by conventional laser pulse(s) 34 of prior art energy distribution.

The technology trend is, however, toward developing more complex, higher density circuits 10 or memories having more layers and smaller link structures 38 and memory cell dimensions. As polysilicon links 22 become smaller and more deeply buried, they become more difficult to sever at the conventional laser outputs and spot size limitations of 1.047 $\mu$m or 1.064 $\mu$m radiation. Expensive and time-consuming processes are often required to delicately etch away passivation layers 40 or other surface layers to make links 22 accessible for subsequent laser severing.

Another impediment to higher density circuits 10 or embedded memories is that the electrical resistance of the conventional polysilicon-like link materials, including polycide and disilicide, increases as dimensions shrink and thereby restricts the operating speed of memory cells 20. To address signal propagation delay associated with the higher electrical resistance attributed to polysilicon-like links 22, memory manufacturers have adopted a variety of more conductive metallic link structure materials such as aluminum, titanium, nickel, copper, tungsten, platinum, metal alloys, metal nitrides, or other metal-like materials.

Another motivation for using metallic links 22 for redundancy repairing is that these metallic links 22 are often located closer to the top of the multi-layer structure of the memory device, thus links 22 are easier for the laser beam to access without the need of etching out windows within multiple covering layers. However, many of these materials are more difficult to process using the 1.047 $\mu$m or 1.064 $\mu$m wavelengths of conventional link processing laser systems because these materials have higher optical reflectivities or higher melting or vaporization points than polysilicon. Generally, laser severing of these metals creates slag and debris that surround the crater and cause a lower open resistance across the severed links 22 and perhaps a circuit failure.

Higher power laser output is required to process the metallic link materials and to eliminate potential debris.

However, increasing the laser output power level has deleterious effects on silicon, gallium arsenide, and other semiconductor substrates 44, other layers 42, and adjacent circuit structures 30.

Alternatively, in U.S. Pat. No. 5,265,114, Sun et al. employ wavelengths, such as 1.3 μm, that exploit the absorption contrast between a target such as a metal link, and a substrate 44, such as silicon. Among other advantages, the method allows the use of higher energy laser pulses to sever links 22 without affecting the silicon substrate 44 and thus creates a greater laser energy processing window than that allowed by conventional 1.047 μm and 1.064 μm laser wavelengths. The open resistance across links 22 processed by this method is much higher than the resistance across links 22 severed by the conventional beams.

As links 22 and pitches 28 become smaller, spot size limitations become more critical. The selection of optical elements and their clearance from substrate 44 influence the practical spot-size limits of link-blowing laser pulses 34. For example, optical elements are generally maintained at least 10 mm above a link structure 38 to avoid contact with slag or other debris that may result from link-blowing. The conventional spot size limit for a link-blowing laser output pulse can be conveniently approximated as twice the wavelength (2λ). Thus, for 1.32, 1.06, and 1.04 μm-emission materials, the practical spot size limits for material removal are roughly 2.64 μm, 2.12 μm, and 2.08 μm, respectively.

Skilled persons will appreciate that shorter wavelengths, such as 0.532 μm, 0.355 μm, or 0.266 μm, could be employed to reduce the smallest focused laser beam spot size for material removal. However, skilled persons will also appreciate that silicon substrates 44 will strongly absorb wavelengths shorter than about 1 μm such that these wavelengths will inevitably damage substrates 44, especially at the high power needed for link blowing.

The smallest focused laser spot 36 currently used in the industry for repairing 64 megabit DRAMs is about a 2.0 μm diameter 46 of laser spot 36. This spot size is expected to be useful through 256 megabit and some 1 gigabit DRAM designs. FIG. 3 is a graph of spot size versus year demonstrating industry demands for smaller spot sizes as link pitch 28 and link width 25 decrease. The graph is based on a simple formula for approximating spot size demands: spot size=2 (minimum link pitch)–(system accuracy)–0.5 (link width). The graph assumes 0.5 μm accuracy through the year 1997, 0.35 μm accuracy through the year 1999, and 0.25 μm accuracy thereafter. Accordingly, industry experts predict that spot sizes under 2 μm will soon be desirable for processing links 22.

SUMMARY OF THE INVENTION

An object of the present invention is, therefore, to provide an alternative method and system for processing targets, such as links.

Accordingly, the present invention provides a system and method for first exposing or ablating an etch protection top layer target material, such as a resist material or other protective coating, with individually directed laser output pulses at multiple random target locations on one or more IC devices and then etching the underlying targets.

In one embodiment of the present invention, a target material on a work piece is coated with a layer of photoresist material. The laser output wavelength is selected to expose, i.e. activate, the photoresist material. Position data then direct individual laser output pulses toward multiple positions on the photoresist material. Because photoresist exposure requires less laser energy than direct link blowing by a laser beam, shorter wavelength lasers can be employed to expose the photoresist above a link 22 that needs to be disconnected without the risk of damage to the substrate or other circuit elements. Finally, the IC device is developed to remove the photoresist, and conventional etching techniques are used to remove the uncovered target or link 22.

In addition to a spot size advantage obtained by using a shorter wavelength, the lower power of the exposure process allows the optical elements to be brought closer to the target and facilitates the practical laser output spot size factor to be approximately as little as one times the wavelength.

Alternatively, an etch protection layer such as resist or other protective coating material can be directly ablated using a slightly higher, but still relatively low, power laser. For example, a low power UV laser can be used to ablate a nonphotosensitive resist material having a low ablation threshold. The developing step is eliminated, and any ablation-related debris disappears when the target is etched or when the rest of the protective layer is removed.

By etching the uncovered links 22 instead of blowing them, IC device manufacturers can utilize smaller spot sizes and can, therefore, design smaller link lengths 26, link widths 25, and pitches 28, as well as avoid low open resistance across the severed links 22 and other problems associated with slag creation. In addition to providing cleaner link removal than is possible by link blowing, the present invention permits much greater laser processing windows than is permitted by link blowing.

Additional objects and advantages of the invention will be apparent from the following detailed description of preferred embodiments thereof, which proceeds with reference to the accompanying drawings.

BRIEF DESCRIPTION OF THE DRAWINGS

FIG. 4A is a fragmentary cross-sectional side view of a photoresist-covered, very narrow target structure receiving a laser pulse characterized by laser pulse parameters in accordance with the present invention.

FIG. 4B is a fragmentary cross-sectional side view of the target structure of FIG. 4A with dashed lines enclosing a laser-activated portion of the photoresist layer.

FIG. 4C is a fragmentary cross-sectional side view of the target structure of FIG. 4B subsequent to a developing step.

FIG. 4D is a fragmentary cross-sectional side view of the target structure of FIG. 4C subsequent to at least one etch processing step.

DETAILED DESCRIPTION OF PREFERRED EMBODIMENTS

Figure 1:
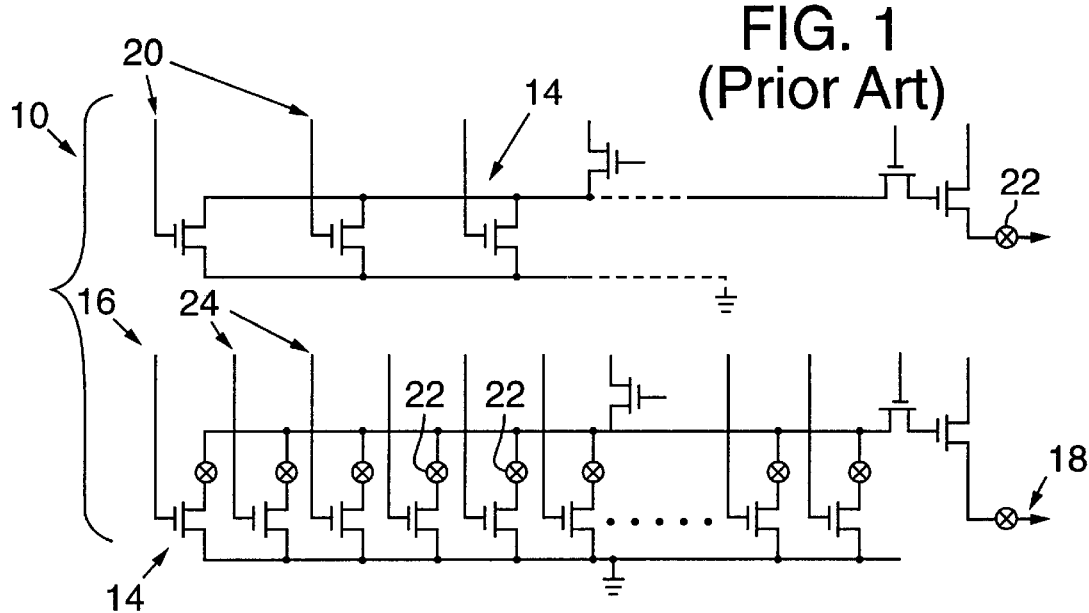
FIG. 1 is a schematic diagram of a portion of a DRAM showing the redundant layout of and programmable links in a spare row of generic circuit cells.

FIGS. 4A, 4B, 4C, and 4D (collectively FIG. 4) are fragmentary cross-sectional side views of a target structure 88 undergoing sequential stages of target processing in accordance with the present invention. With reference to FIG. 4, target structure 88 includes an etch target or link 92 that may comprise metal or any other etch-sensitive target material. Target structure 88 can have much smaller features and dimensions than those blown by conventional link-blowing laser pulses 34, i.e. link length 85 and link width (not shown) can be designed to be smaller than those of links blown by conventional link-blowing laser pulses 34. Similarly, the pitch between links 92 can be substantially smaller than the pitch between links blown by conventional link blowing laser pulses 34. For convenience, certain features of target structure 88 that correspond to features of link structure 38 of FIG. 2A have been designated with the same reference numbers.

With respect to FIG. 4, link 92 is positioned below an etch protection top layer 90 of a positive photoresist material. Photoresist layer 90 may be a remnant from a prior lithographic or other circuit fabrication process or may be newly applied. Photoresist materials include, but are not limited to, Novolak (M-Cresol formaldehyde) or etch-resistant poly coatings such as Poly isoprene or Poly-(methyl isopropenyl ketone) (PMIPK). The photoresist material may be selected in accordance with standard photoresist selection criteria.

Photoresist materials are tuned to be sensitive to one or more specific wavelengths or wavelength ranges. Conventional resist wavelength sensitivities include the G, H, and I mercury lines at 436 nm, 405 nm, and 365 nm, respectively. Newer deep ultraviolet resist wavelength sensitivities include 193 nm and 248 nm, as disclosed by Allen et al. in "New single-layer positive resists for 193-and 248-nm lithography using methacrylate polymers," Solid State Technology (November 1993), at pp. 53–66. Skilled persons will appreciate that the third harmonic of Nd:YAG laser closely matches the mercury I-line and HeCd laser emission closely matches the mercury G-line. Because they are widely available and match the third harmonics of Nd:YAG and Nd:YLF, I-line resists are currently preferred for this invention.

FIG. 4A shows target structure 88 receiving a laser pulse 94 characterized by pulse parameters in accordance with the present invention. Pulse 94 can have a much lower power than conventional link-blowing pulse 34 because the power necessary for exposing photoresist layer 90 is significantly lower than the power needed to blow link 22 and passivation layer 40.

The power requirements for laser processing of photoresist at particular wavelengths are scaled in proportion to the spot size used. Preferred exposure parameters may include average powers lower than about 50 mJ/cm$^2$, and preferably lower than 10 mJ/cm$^2$, over the beam spot area; pulses of 5–100 ns duration; and a repetition rate of greater than about 300 Hz. Skilled persons will appreciate that the laser pulses can be developed by pulsed lasers, such as with a Q-switch 180, operating in accordance with conventional techniques or by continuous-wave lasers cooperating with a shutter periodically opening to provide continuous-wave emission for specified times and thereby form laser pulses.

The nonablative lower powers facilitated by the photoresist exposure process permit laser system optical elements (such as imaging lens 148 shown in FIG. 6) to be positioned closer to target structure 88 since slag and other ablation debris are not generated. The permissible lower minimum clearance (perhaps as little as 4 mm or even lower) allows the beam waist and hence the spot size diameter 98 to be a significantly smaller function of the wavelength of laser output pulse 94, such as about one or one and a half times the wavelength.

The large variety of photoresist sensitivities and corresponding laser outputs that can be employed by the photoresist exposure process substantially increase the processing window for the parameters of laser pulse 94. Photoresist exposure provides, therefore, more choices for laser sources that can be selected based on other criteria such as wavelength, spot size, and availability. For example, wavelengths much shorter than 1 Am, such as 355 nm, 266 nm or 212 nm, can be employed to produce critical spot size diameters 98 (or spatial major axes where the beam waist is elliptical) of less than 500 nm.

FIG. 4B shows target structure 88 after photoresist target portion 100 of photoresist layer 90 has been exposed to photoresist exposure laser pulse 94. Photoresist target portion 100 is depicted within dashed lines and has been activated by laser pulse 94 such that photoresist target portion 100 will be removed during a subsequent developing step. Developing processes and agents are well known to persons skilled in the art. FIG. 4C shows an uncovered passivation target portion 104 of passivation layer 40 of target structure 88 of FIG. 4B after photoresist target portion 100 (indicated by arrows where removed) of photoresist layer 90 has been removed by a developing step.

FIG. 4D shows target structure 88 of FIG. 4C after passivation target portion 104 of passivation layer 50 and link target portion 106 of link 92 have been removed by etching. Target portions 104 and 106 are indicated by arrows where they have been removed. Skilled persons will recognize that etching, particularly chemical and plasma etching, is well known from photolithography and other circuit fabrication processes. Etching these layers can be a single-step process that employs a single agent or a two-step process that employs separate agents for etching passivation target portion 104 and then link target portion 106 of link 92.

Figure 5A:
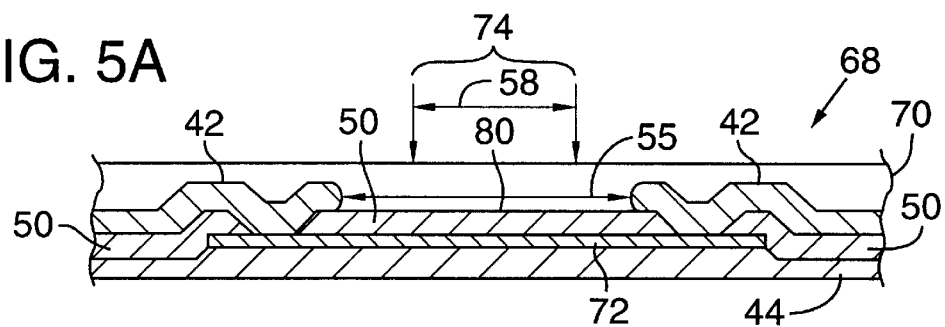
FIG. 5A is a fragmentary cross-sectional side view of a target structure, covered by a protective layer, receiving a laser pulse characterized by laser pulse parameters in accordance with the present invention.
Figure 5B:
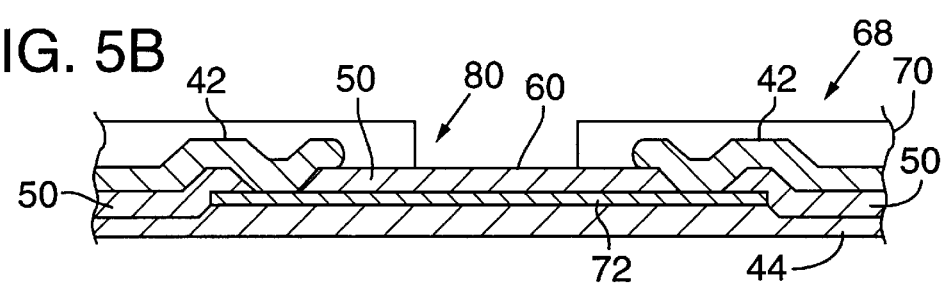
FIG. 5B is a fragmentary cross-sectional side view of the target structure of FIG. 5A subsequent to a laser ablation processing step.
Figure 5C:
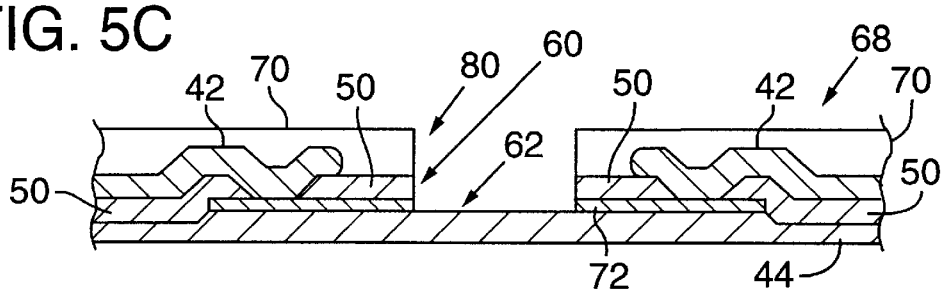
FIG. 5C is a fragmentary cross-sectional side view of the target structure of FIG. 5B subsequent to at least one etch processing step.

FIGS. 5A, 5B, and 5C (collectively FIG. 5) are fragmentary cross-sectional side views of target structure 68 undergoing alternative sequential stages of target processing in accordance with the present invention. Target structure 68 can also have smaller dimensions than those blown by conventional link-blowing laser pulses 34. For convenience, certain features of target structure 68 that correspond to features of target structure 38 of FIG. 2A have been designated with the same reference numbers.

With reference to FIG. 5, target structure 68 comprises an etch protection top layer 70 that covers an etch target such as passivation layer 50 and link 72. The etch protection top layer 70 may include any protective coating such as any of the resist materials discussed above with respect to FIG. 4;

however, the resist material need not be a photoresist and may comprise any form of resist material with or without photosensitizers, particularly materials having a low laser ablation threshold for the selected wavelength of laser output pulse 74. Nonphotosensitive resist materials include a wider variety of materials than can be used as photoresist materials. Skilled persons will appreciate that conventional photoresists without their photosensitizers can also be employed.

Figure 2A:
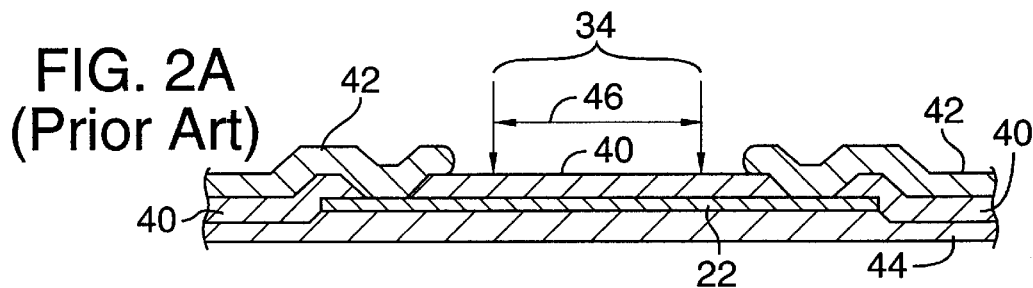
FIG. 2A is a fragmentary cross-sectional side view of a conventional, large semiconductor link structure receiving a laser pulse characterized by a prior art pulse parameters.
Figure 2B:
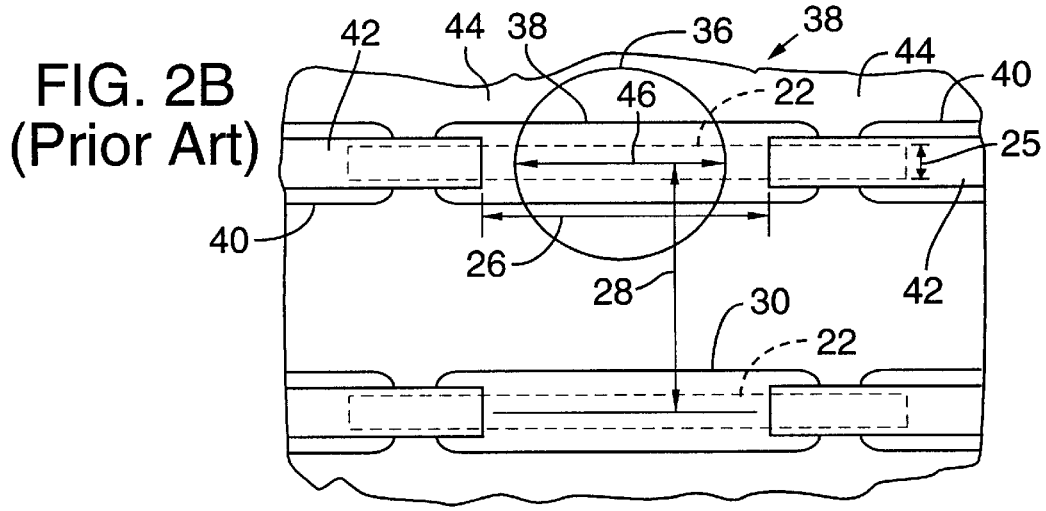
FIG. 2B is a fragmentary top view of the link structure and the laser pulse of FIG. 2A, together with an adjacent circuit structure.
Figure 2C:
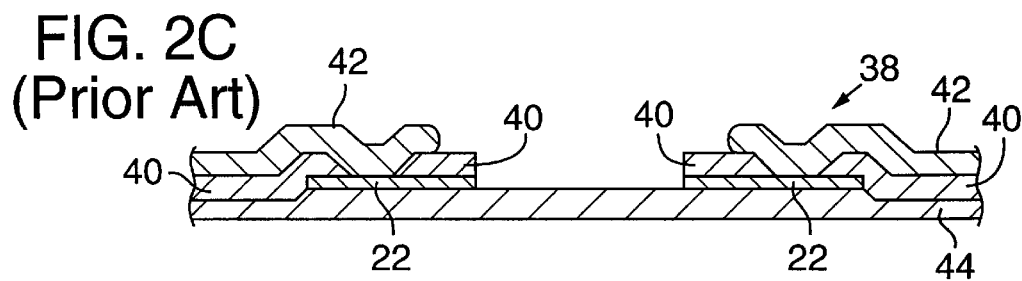
FIG. 2C is a fragmentary cross-sectional side view of the link structure of FIG. 2B after the link is removed by the prior art laser pulse.
Figure 3:
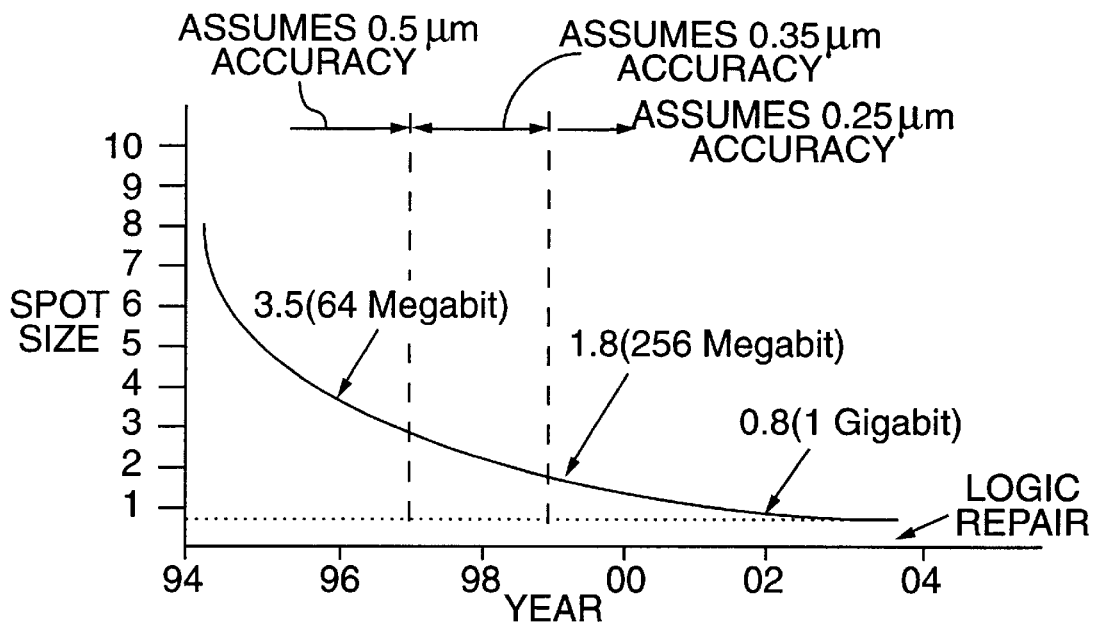
FIG. 3 is a graph of spot size versus year predicting the laser spot sizes that will be needed over time for link processing.

FIG. 5A shows etch protection top layer 70 of a target structure 68 receiving a laser pulse 74 characterized by a resist ablation energy distribution adapted to achieve top layer ablation in accordance with the present invention. Pulse 74 can have a much lower power than conventional pulse 34 because the power necessary for ablating etch protection top layer 70 can be significantly lower than the power needed to blow link 22 (and passivation layer 50) as shown in FIGS. 2A and 2C. The lower powers facilitated by the etch protection layer-ablation and target-etch process substantially increase the processing window for the parameters of laser pulse 74. Therefore, top layer ablation provides more choices for laser sources that can be selected based on other criteria such as wavelength, spot size, and availability. For example, wavelengths much shorter than 1.042 $\mu$m, such as 355 $\mu$m, 266 $\mu$m, or 212 $\mu$m, can be employed to produce critical spot size diameters 58 of significantly less than about 2 $\mu$m and preferably less than about 1.0 $\mu$m.

In general, other preferred ablation parameters include average powers lower than about 50 mJ/cm$^2$ for 1 $\mu$m-thick resist measured over the beam spot area, a repetition rate of greater than about 300 Hz, and a wavelength preferably less than about 400 nm, such as but not limited to those listed above. FIG. 5B shows target structure 68 after etch protection target portion 80 (indicated by an arrow where removed) of etch protection top layer 70 has been removed by laser pulse 74.

FIG. 5C shows target structure 68 of FIG. 5B after target portion 60 of the passivation layer 50 and target portion 62 of link 72 have been removed by etching. Etching these layers, as discussed with respect to FIG. 4D, can be a single-step process that employs one agent or a two-step process that employs separate agents for etching passivation target portion 60 and then link target portion 62.

The etch protection top layer ablation technique described with respect to FIG. 5 is far less likely to generate debris common to link-blowing processes. If debris is generated, then the electrically nonconductive composition of the etch protection layer 70 or passivation layer 50 is less likely to negatively affect the open resistance between links 72 and adjacent circuit structures 30. Finally, any such debris would be removed when link is etched or the resist layer is removed during subsequent processing. The substrate protection and smaller critical dimensions afforded by the top layer-ablating and target-etching process are, therefore, significant improvements over the conventional link-blowing process.

The embodiments described with respect to FIGS. 4 and 5 permit IC manufacturers to laser process unique positions 150 (FIG. 6) on-the-fly on circuit elements 14 having minimum pitch dimensions limited primarily by the emission wavelength of the laser pulses 74 and 94. In particular, the photoresist exposure and link etch method for processing links can employ similar wavelengths to those used in photolithography, thus permitting the critical dimensions necessary for link removal to match and keep pace with the critical dimensions achievable in photolithographic circuit design. Links 92 can, for example, be within 2 $\mu$m of other links or adjacent circuit structures 30, and assuming photolithographic processes can yield a 250-nm link widths, the present invention can selectively remove it without substrate damage. Skilled persons will also appreciate that because etching can remove thicker links more effectively than link blowing can, memory manufacturers can decrease link width 25 by designing thicker links to maintain or increase signal propagation speed.

Figure 6:
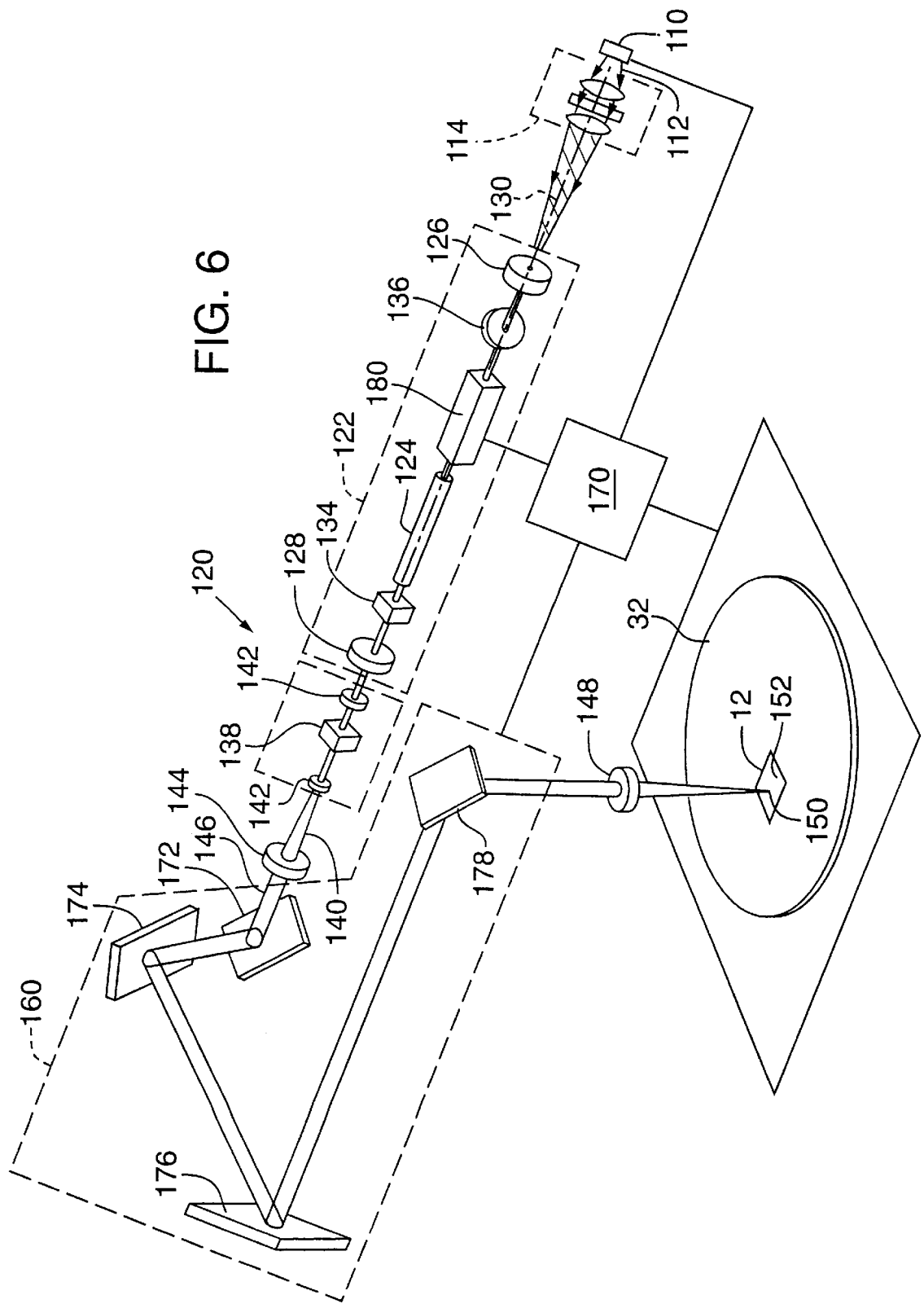
FIG. 6 is a partly schematic, simplified diagram of one embodiment of a laser system incorporating the present invention.

FIG. 6 shows a preferred embodiment of a simplified laser system 120 for generating laser pulses desirable for achieving the processing advantages of the present invention. Laser system 120 includes a resonator 122 having a lasant 124 positioned between a rear mirror 126 and an output mirror 128 along an optic axis 130. Mirror 126 is preferably 100 percent reflective, and mirror 128 is partly transmissive to light propagating along optic axis 130. For convenience, laser system 120 is modeled herein only by way of example to a third harmonic Nd:YAG laser pump by a laser diode 110, the emission 112 of which is focused by lens components 114 into resonator 122. Modification of a laser system such as, for example, the Models 9000, 9100, 9200, or 9300 series, manufactured by Electro Scientific Industries, Inc., Portland, Oreg., is preferred for adaptation by skilled persons to accommodate a shorter wavelength, UV laser.

With reference to FIGS. 4 and 5, laser system 120 emits output pulses 74 or 94 at short wavelengths such as those that closely match a wavelength of sensitivity of etch protection layers 70 or 90. A number of lasers, such as a HeCd emitting at 442 nm and the third Harmonics of Nd:YAG and Nd:YLF emitting respectively at 355 nm and 349 nm, are known to skilled persons and emit light at or close enough to the peak wavelength sensitivities of conventional photoresist materials to sufficiently activate photochemicals within the photoresists.

Skilled persons will appreciate that laser frequency conversion and/or tuning and related components 134, 136, and 138 are not required when the lasant's emission wavelength closely matches the wavelength of sensitivity of the photoresist. However, the output of YAG or other lasants 124 can be converted to other exposure or preferred ablation wavelengths through known processes such as optical parametric oscillation or nonlinear frequency conversion, such as doubling, tripling, or quadrupling.

Laser system output 140 can be manipulated by a variety of conventional optics including beam expander lens components 142 and 144 that are positioned along a beam path 146. Finally, the laser system output 140 is passed through a focusing or imaging lens 148 before being applied to laser target position 150 within top layer 152 (at least one of layers 50, 70, or 90) on chip 12 of wafer 32. Imaging lens 148 preferably employs an Fl, F2, or F3 single component or multicomponent lens system.

A preferred beam positioning system 160 is described in detail in U.S. Pat. No. 4,532,402 of Overbeck. Beam positioning system 160 preferably employs a laser controller 170 that controls at least two platforms or stages and multiple reflectors 172, 174, 176, and 178 to target and focus laser system output 140 to a desired laser target position 150 on top layer 152 covering target structure 68 or 88. Beam positioning system 160 permits quick movement between target positions 150 on the same or different dies to effect unique link blowing or trimming operations based on provided test or design data. The position data preferably direct one pulse of laser system output 140 at a time toward each of multiple discrete target positions 150 on the photoresist material to expose or ablate the top layer 152 above each target position. Skilled persons will appreciate that multiple pulses can be directed to each target position 150 but at a substantial throughput penalty.

For intracavity laser beam modulation employing a Q-switch 180 as shown in FIG. 6, laser controller 170 may be influenced by timing data that synchronizes the firing of laser system 120 to the motion of the platforms such as described in U.S. Pat. No. 5,453,594 of Konecny for Radiation Beam Position and Emission Coordination System. Alternatively, skilled persons will appreciate that laser controller 170 may be used for extracavity modulation of continuous wave (CW) laser energy via a Pockel cell or an acousto-optic device, for example, to deliver laser output pulses having 5 ns to 100 ns duration. This alternative can provide constant peak power regardless of the chopping repetition rate or output pulse duration time. Beam positioning system 160 may alternatively or additionally employ the improvements or beam positioners described in U.S. patent application Ser. Nos. 08/408,558 and 08/615,049 of Cutler et al.

It will be obvious to those having skill in the art that many changes may be made to the details of the above-described embodiments of this invention without departing from the underlying principles thereof. The scope of the present invention should, therefore, be determined only by the following claims.

We claim:

1. A method of selectively removing target material embedded in a semiconductor device, the target material supported at different locations on a substrate and covered by at least an etch protection layer, comprising:

providing to a beam positioner beam positioning data representing locations of the target material embedded in the semiconductor device;

generating, from a laser, laser output pulses at a wavelength shorter than 500 nm and having an energy density of less than or equal to 50 mJ/cm$^2$; and directing, in response to the beam positioning data, the laser outputs to impinge the etch protection layer at positions that are spatially aligned depthwise with the respective locations of the target material, each of the positions being impinged with at least one separate laser output not directed at another position, and each laser output having spatial dimensions defining a region of the etch protection layer that is to be removed, the region having a spatial spot size of a diameter of less than 2 $\mu$m, the etch protection layer including a photoresist material, and each laser output having an energy density sufficient to activate the region of the etch protection layer spatially aligned with the position and insufficient to remove the region of the etch protection layer spatially aligned with the position.

2. The method of claim 1, further comprising:

generating the multiple laser outputs at a repetition rate of greater than 300 Hz.

3. The method of claim 2 in which the laser outputs are generated by the same laser and each position is impinged at a separate time.

4. The method of claim 1 in which the etch protection layer comprises positive photoresist material and the laser output is generated with sufficient energy to activate the region of the photoresist material at the position spatially aligned with the location.

5. The method of claim 4 in which the laser output is generated at a wavelength sufficiently close to a peak wavelength sensitivity of a mercury G-, H-, or I-line photoresist to activate the photoresist.

6. The method of claim 4 wherein causing removal of the region, further comprises:

developing the etch protection layer to remove the regions of the etch protection layer impinged by the laser outputs.

7. The method of claim 1 in which the region comprises a diameter that is less than 1 $\mu$m.

8. The method of claim 1, further comprising generating the laser output at a wavelength that is shorter than or equal to 349 nm.

9. The method of claim 1 in which the target material is within 2 $\mu$m from an adjacent circuit structure.

10. The method of claim 1 in which at least one of the locations of target material comprises a link in a field programmable gate array or a redundant memory cell.

11. The method of claim 1 in which at least one of the target materials comprises aluminum, cesium silicide, chromide, copper, doped polysilicon, disilicide, gold, nickel, nickel chromide, platinum, polycide, tantalum nitride, titanium, titanium nitride, or tungsten.

12. A method employing on-the-fly laser output pulses to process positions on an etch protection layer covering respective links lying spatially below the etch protection layer and within about 2 $\mu$m of an adjacent circuit structure and in proximity to a substrate that is susceptible to damage from the laser output pulses, comprising:

providing to a beam positioner beam positioning data representing locations of the links to be processed;

generating solid-state laser output pulses at a wavelength shorter than or equal to 349 nm and a repetition rate of greater than 300 Hz; and impinging, with the laser output pulses, regions of the etch protection layer that are spatially aligned with the locations of the links such that each region is impinged by a separate laser output pulse having a spatial spot size of a diameter of less than 1 $\mu$m and characterized by an energy distribution of less than or equal to 50 mJ/cm$^2$ that is sufficient to ablate the region of the etch protection layer and expose a portion of the link but insufficient to blow the link or damage the substrate.

13. The method of claim 12, further comprising:

performing an etch process to remove the exposed regions of the links.

14. The method of claim 12 in which the etch protection layer comprises a resist material without photosensitizers.

15. The method of claim 8 in which the laser output comprises a 266 nm or 212 nm wavelength.

16. The method of claim 4 in which the laser output is generated at a 355 nm, 266 nm, or 212 nm wavelength.

17. The method of claim 1 in which the laser outputs each have an energy density comprising less than 10 mJ/cm$^2$.

18. The method of claim 4 in which the laser outputs are generated by a solid-state laser and each have an energy density comprising less than 10 mJ/cm$^2$.

19. The method of claim 1 further comprising a third harmonic Nd:YAG or Nd:YLF laser for generating the laser outputs.

20. The method of claim 1 further comprising causing removal of the regions of the etch protection layer to which the laser outputs are directed; and performing an etch process to remove the target material at the locations spatially aligned depthwise with the removed regions of the etch protection layer.

21. The method of claim 6 further comprising performing an etch process to remove the target material at the locations spatially aligned depthwise with the removed regions of the etch protection layer.

22. The method of claim 17 in which the laser output is generated at a wavelength sufficiently close to a peak wavelength sensitivity of a mercury G-, H-, or I-line photoresist to activate the photoresist.

23. The method of claim 22 in which the region comprises a diameter that is less than 1 µm.

24. The method of claim 17 in which the region comprises a diameter that is less than 1 µm.

25. The method of claim 17, further comprising generating the multiple laser outputs at a repetition rate of greater than 300 Hz.

26. The method of claim 17 further comprising developing the etch protection layer to remove the regions of the etch protection layer impinged by the laser outputs.

27. The method of claim 26 further comprising performing an etch process to remove the target material at the locations spatially aligned depthwise with the removed regions of the etch protection layer.

28. The method of claim 23 further comprising:

developing the etch protection layer to remove the regions of the etch protection layer impinged by the laser outputs; and performing an etch process to remove the target material at the locations spatially aligned depthwise with the removed regions of the etch protection layer.

29. The method of claim 17 further comprising positioning a laser optical element within about 4 mm of the etch protection layer.

30. The method of claim 1 further comprising positioning a laser optical element within about 4 mm of the etch protection layer.

* * * * *